United States Patent
Kim et al.

(10) Patent No.: US 9,657,394 B2
(45) Date of Patent: May 23, 2017

(54) HOT PLATE AND METHOD OF MANUFACTURING THE SAME

(71) Applicant: LG INNOTEK CO., LTD., Jung-gu, Seoul (KR)

(72) Inventors: Ick Chan Kim, Seoul (KR); Moo Seong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 218 days.

(21) Appl. No.: 14/353,199

(22) PCT Filed: Oct. 19, 2012

(86) PCT No.: PCT/KR2012/008622
§ 371 (c)(1),
(2) Date: Apr. 21, 2014

(87) PCT Pub. No.: WO2013/058610
PCT Pub. Date: Apr. 25, 2013

(65) Prior Publication Data
US 2014/0251976 A1    Sep. 11, 2014

(30) Foreign Application Priority Data

Oct. 19, 2011  (KR) .................. 10-2011-0107200

(51) Int. Cl.
*H05B 3/68* (2006.01)
*H05B 3/74* (2006.01)
(Continued)

(52) U.S. Cl.
CPC .......... *C23C 26/00* (2013.01); *C23C 16/4581* (2013.01); *H01L 21/67103* (2013.01)

(58) Field of Classification Search
CPC ....... H05B 3/68; H05B 3/74; H01L 21/02365; H01L 31/12
(Continued)

(56) References Cited

U.S. PATENT DOCUMENTS 5,183,997 A * 2/1993 Lotz ................. H05B 3/744
                                                219/455.12
5,464,966 A * 11/1995 Gaitan ................. B01L 7/00
                                                219/543
(Continued)

FOREIGN PATENT DOCUMENTS

JP      2004-296492 A    10/2004
JP      2005-197534 A     7/2005
(Continued)

OTHER PUBLICATIONS

International Search Report in International Application No. PCT/KR2012/008622, filed Oct. 19, 2012.

*Primary Examiner* — Michael Laflame, Jr.
(74) *Attorney, Agent, or Firm* — Saliwanchik, Lloyd & Eisenschenk

(57) ABSTRACT

Disclosed are a hot plate and a method of manufacturing the same. The method includes the steps of preparing a first barrier layer, laminating a first heat transfer layer on the first barrier layer, and laminating a second barrier layer on the first heat transfer layer. The first barrier layer or the second barrier layer includes a plurality of first sub-nano-barrier layers and a plurality of second sub-nano-barrier layers. The hot plate includes a first barrier layer, a first heat transfer layer on the first barrier layer, and a second barrier layer on the first heat transfer layer. The first barrier layer or the second barrier layer includes a plurality of first sub-nano-barrier layers and a plurality of second sub-nano-barrier layers.

11 Claims, 2 Drawing Sheets

(51) Int. Cl.
*C23C 26/00* (2006.01)
*C23C 16/458* (2006.01)
*H01L 21/67* (2006.01)

(58) Field of Classification Search
USPC .... 219/443.1, 444.1; 427/402, 419.1, 419.7; 136/204, 207, 239, 228; 165/185
See application file for complete search history.

(56) References Cited

U.S. PATENT DOCUMENTS

| | | | | |
|---|---|---|---|---|
| 5,886,390 | A * | 3/1999 | Nishimoto | H01L 35/16 136/203 |
| 6,131,651 | A * | 10/2000 | Richey, III | F28F 13/00 165/185 |
| 6,397,931 | B1 * | 6/2002 | Lin | F28F 3/027 165/185 |
| 6,821,578 | B2 * | 11/2004 | Beele | C23C 28/00 427/248.1 |
| 2003/0215642 | A1 * | 11/2003 | Carre | C03C 17/22 428/408 |
| 2008/0083732 | A1 * | 4/2008 | Shinma | H01L 21/67109 219/444.1 |
| 2009/0236087 | A1 * | 9/2009 | Horio | H01L 35/30 165/185 |
| 2010/0103584 | A1 | 4/2010 | Nam | |
| 2010/0301348 | A1 * | 12/2010 | Kamikawa | B82Y 20/00 257/76 |

FOREIGN PATENT DOCUMENTS

| | | |
|---|---|---|
| KR | 10-0891316 B1 | 4/2009 |
| KR | 10-2010-0046909 A | 5/2010 |

* cited by examiner

HOT PLATE AND METHOD OF MANUFACTURING THE SAME

CROSS-REFERENCE TO RELATED APPLICATIONS

This application is the U.S. national stage application of International Patent Application No. PCT/KR2012/008622, filed Oct. 19, 2012, which claims priority to Korean Application No. 10-2011-0107200, filed Oct. 19, 2011, the disclosures of each of which are incorporated herein by reference in their entirety.

TECHNICAL FIELD

The embodiment relates to a hot plate and a method of manufacturing the same.

BACKGROUND ART

In general, among technologies to form various thin films on a substrate or a wafer, a CVD (Chemical Vapor Deposition) scheme has been extensively used. The CVD scheme results in a chemical reaction. According to the CVD scheme, a semiconductor thin film or an insulating layer is formed on a wafer surface by using the chemical reaction of a source material.

The CVD scheme and the CVD device have been spotlighted as an important thin film forming technology due to the fineness of the semiconductor device and the development of high-power and high-efficiency LED. Recently, the CVD scheme has been used to deposit various thin films, such as a silicon layer, an oxide layer, a silicon nitride layer, a silicon oxynitride layer, or a tungsten layer, on a wafer. In addition, studies and researches on a wafer having a large diameter have been continuously performed in order to reduce the manufacturing cost.

However, the CVD scheme, which has been recently employed, has difficulty in providing uniform temperature distribution when increasing the size of a susceptor or a hot plate. Accordingly, depositing an epitaxial layer on a substrate or a wafer having the size of 6" or more under development may be difficult.

In a susceptor employed in the conventional CVD scheme, after providing a wafer or a substrate on a hot plate, various thin films are deposited on the wafer or the substrate. In this case, the hot plate may include a material having resistance against a high temperature. A hot plate used in the deposition of silicon carbide (SiC) may mainly include SiC. The SiC has a conductor representing the thermal conductivity of 300 W/mK.

However, as the wafer is manufactured with a large diameter, the hot plate is enlarged, so that heat may not be uniformly transferred on the wafer. Therefore, the thin film is irregularly deposited on the wafer, so that the characteristic of the thin film may be degraded.

Referring to a reference "Pernot, G., et al. Precise control of thermal conductivity at the nanoscale through individual phonon-scattering barriers. Nat Mater 9, 491-495 (2010).", the reference discloses the coating of Si/Ge in multiple layers including nano-size single layers.

If the material is coated in a nano-size, thermal conductivity is significantly reduced as compared with bulk silicon. In other words, the thermal conductivity of the nano-size material is significantly lower than that of the bulk material. Accordingly, even if a bulk material is the same as the nano-size material, the bulk material and the nano-size material make difference in the thermal conductivity due to the size effect.

Therefore, the hot plate according to the present embodiment aims at fabricating a hot plate capable of uniformly distributing temperature on the wafer by using the difference in the thermal conductivity caused by the size effect.

DISCLOSURE OF INVENTION

Technical Problem

The embodiment provides a method of manufacturing a hot plate, capable of uniformly transferring heat to a wafer provided on a susceptor and the hot plate manufactured by the method.

Solution to Problem

According to the embodiment, there is provided a hot plate including a first barrier layer, a first heat transfer layer on the first barrier layer, and a second barrier layer on the first heat transfer layer. The first barrier layer or the second barrier layer includes a plurality of first sub-nano-barrier layers and a plurality of second sub-nano-barrier layers.

According to the embodiment, there is provided a method of manufacturing a hot plate, which includes the steps of preparing a first barrier layer, laminating a first heat transfer layer on the first barrier layer, and laminating a second barrier layer on the first heat transfer layer. The first barrier layer or the second barrier layer includes a plurality of first sub-nano-barrier layers and a plurality of second sub-nano-barrier layers.

Advantageous Effects of Invention

As described above, the hot plate according to the embodiment includes the barrier layer and the heat transfer layer provided on the barrier layer. In addition, the barrier layer is formed by alternately laminating the first sub-nano-barrier layers and the second sub-nano-barrier layers.

Since the barrier layer has a lamination structure of plural double layers or plural multiple layers having nano sizes, the barrier layer can represent significantly low thermal conductivity.

Accordingly, in the heat transfer layer interposed between the barrier layers, the heat transfer in the horizontal direction can be more strongly represented as compared with the heat transfer in the vertical direction.

Therefore, when the size of the susceptor is increased according to the increase in the wafer size, the temperature gradient in the horizontal direction is reduced on the increased surface area of an upper portion of the susceptor, so that thermal energy can be uniformly supplied to the whole area of the wafer.

MODE FOR THE INVENTION

Figure 1:
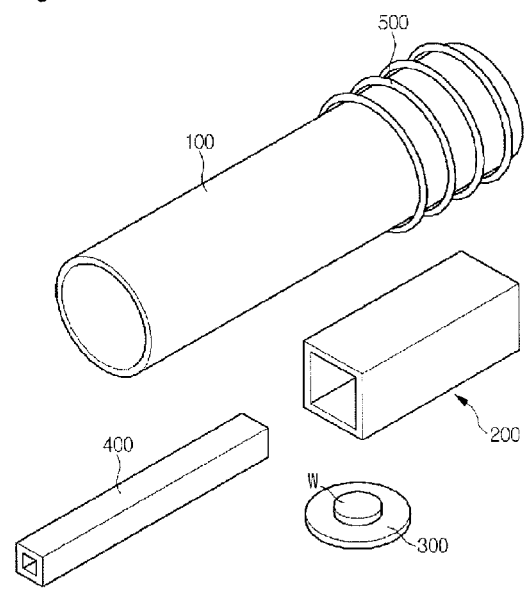
FIG. 1 is an exploded perspective view showing a deposition apparatus according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the purpose of convenience or clarity. In addition, the size of each layer (or film), each region, each pattern, or each structure does not utterly reflect an actual size.

Hereinafter, the embodiment of the present invention will be described in detail with reference to accompanying drawings.

Figure 2:
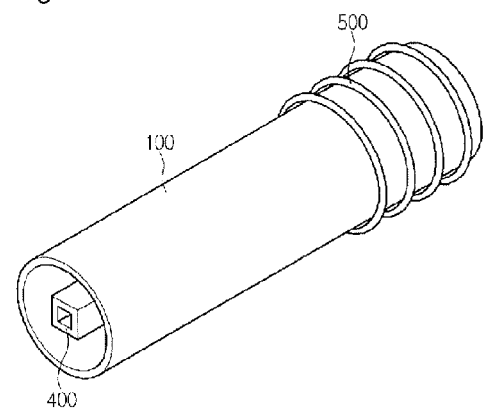
FIG. 2 is a view showing the deposition apparatus according to the embodiment.

FIGS. 1 and 2 are perspective views showing a deposition apparatus according to the embodiment.

Referring to FIGS. 1 and 2, the deposition apparatus may include a chamber 100, a susceptor 200 provided in the chamber 100, a hot plate 300 provided in the susceptor 200, a feeding gas line 400 into which reactive gas is introduced, and an induction coil 500 surrounding an outer peripheral portion of the chamber 100.

The chamber 100 may have the shape of a cylindrical tube. In addition, the chamber 100 may have the shape of a rectangular box. The chamber 100 may receive the susceptor 200. Further, although not shown, the chamber 100 is provided at one lateral side thereof with a gas inlet part used to introduce a precursor and a gas outlet part used to exhaust gas.

In addition, both ends of the chamber 100 are sealed, so that the chamber 100 prevents external gas from being introduced to the inside thereof to maintain the degree of a vacuum. The chamber 100 may include quartz representing high mechanical strength and chemical durability. In addition, the chamber 100 represents improved heat resistance.

In addition, the chamber 100 may be additionally provided therein with an adiabatic part. The adiabatic part can conserve the heat inside the chamber 100. The material constituting the adiabatic part may include ceramic nitride, ceramic carbide, or graphite.

The susceptor 200 is provided in the chamber 100. The susceptor 200 receives a substrate such as the hot plate and/or a wafer W.

The susceptor 200 may include graphite which represents high heat resistance so that the susceptor 200 can endure a high-temperature condition and facilitates the fabrication of the susceptor 200. In addition, the susceptor 200 may have a structure in which silicon carbide is coated on a graphite body. In addition, the susceptor 200 may be inductive heated.

The reactive gas supplied to the susceptor 200 is decomposed into radicals by heat. In this state, the reactive gas decomposed into radicals may be deposited on the wafer W. For example, methyltrichlorosilane (MTS) is decomposed into radicals including silicon (Si) or carbon (C), and a silicon carbide epitaxial layer may be grown from the wafer W. In more detail, the radical may include $CH_3.$, $CH_4$, $SiCl_3$. and $SiCl_2$.

Figure 3:
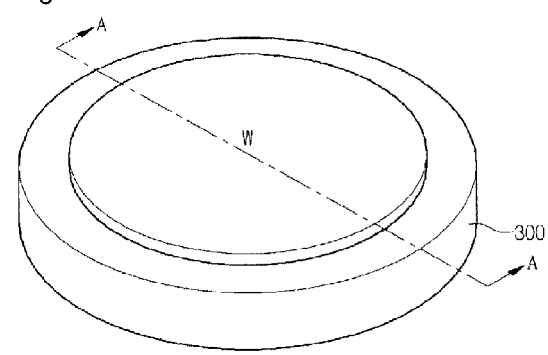
FIG. 3 is a perspective view showing a hot plate and a wafer according to the embodiment.
Figure 4:
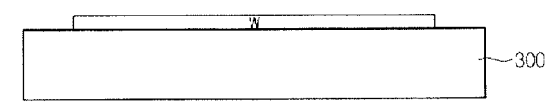
FIG. 4 is a sectional view taken along line A-A' of FIG. 3.

FIG. 3 is a perspective view showing the hot plate and the wafer according to the embodiment, and FIG. 4 is a sectional view taken along line A-A' of FIG. 3.

Referring to FIGS. 3 and 4, the wafer W may be provided on the hot plate 300. The wafer W is provided on the hot plate 300 received in the chamber 100 to react to the reactive gas supplied into the susceptor 200, so that the epitaxial layer can be grown on the wafer W. The hot plate 300 may transfer heat generated by the inductive coil 500 to the wafer W.

Figure 5:
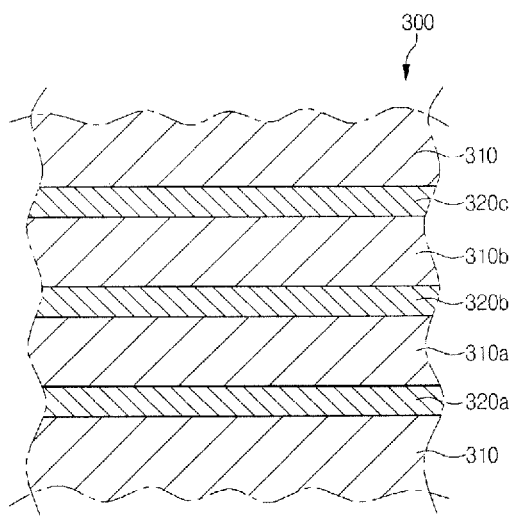
FIG. 5 is a view showing a layer structure of the hot plate according to the embodiment.

FIG. 5 is a view showing a layer structure of the hot plate according to the embodiment. In addition, FIG. 6 is a view showing a layer structure of a barrier layer according to the embodiment.

Figure 6:
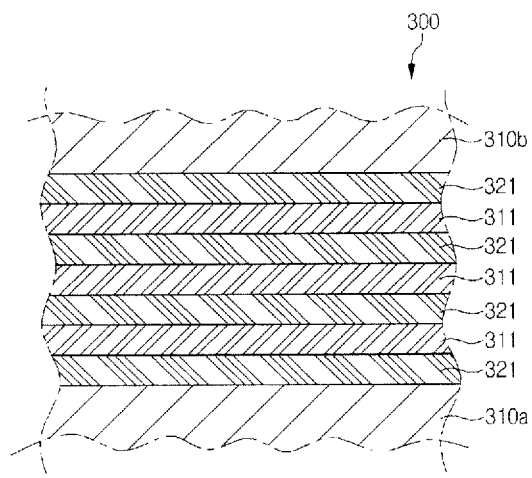
FIG. 6 is a view showing a layer structure of a barrier layer according to the embodiment.

Referring to FIGS. 5 and 6, the hot plate 300 according to the embodiment may include a first barrier layer 320a, a first heat transfer layer 310a provided on the first barrier layer 320a, and a second barrier layer 320b provided on the first heat transfer layer 310a. The first barrier layer 320a or the second barrier layer 320b may include a plurality of first sub-nano-barrier layers 311 and a plurality of second sub-nano-barrier layers 321.

In addition, the hot plate 300 according to the embodiment may further include a second heat transfer layer 310b provided on the second barrier layer 320b and a third barrier layer 320c provided on the second heat transfer layer 310b, and the third barrier layer 320c may include the first sub-nano-barrier layers 311 and the second sub-nano-barrier layers 321. However, the embodiment is not limited thereto, and the hot plate 300 according to the embodiment may further include a plurality of barrier layers including sub-nano-barrier layers.

The hot plate 300 may be formed by alternately laminating the heat transfer layer and the barrier layer on each other. The hot plate 300 may be formed by alternately laminating a plurality of barrier layers and a plurality of heat transfer layers in addition to the first, second, and third barrier layers and the first and second heat transfer layers. In addition, a top surface of the hot plate 300 is coated with silicon carbide at a thickness of about 100 μm or more, so that the hot plate 300 can be prevented from being contaminated at the high temperature of about 900° C. or more.

The first barrier layer 320a, the second barrier layer 320b, or the third barrier layer 320c may be formed by alternately laminating the first sub-nano-barrier layers 311 and the second sub-nano-barrier layers 321. The first sub-nano-barrier layers 311 and the second sub-nano-barrier layers 321 may be laminated on each other in a nano-size unit. Preferably, the thickness of each first sub-nano-barrier layer 311 may be in the range of 2 nm to about 50 nm, and the thickness of each second sub-nano-barrier layer 321 may be in the range of 2 nm to about 50 nm.

The thickness of the first barrier layer 320a or the second barrier layer 320b formed by alternately laminating the first sub-nano-barrier layers 311 and the second sub-nano-barrier layers 321 may be in the range of about 0.5 μm to about 100 μm. Preferably, the thickness of the first barrier layer 320a or the second barrier layer 320b may be at least 30% of the thickness of the heat transfer layer 310.

The first barrier layer 320a or the second barrier layer 320b may be formed by alternately laminating a plurality of sub-nano-barrier layers in addition to a plurality of the first sub-nano-barrier layers and a plurality of the second sub-nano-barrier layers.

The first heat transfer layer 310a may be provided on the first barrier layer 320a. The first heat transfer layer 310a may include an aluminum nitride (AlN) layer, a hafnium nitride (HfN) layer, or a silicon carbide (SiC) layer. In addition, the second barrier layer 320b is laminated on the first heat transfer layer 310a, so that the first heat transfer layer 310a may be interposed between the first barrier layer 320a and the second barrier layer 320b. The thickness of the first heat transfer layer 310a may be in the range of about 500 nm to about 500 μm.

The heat transfer layer may include an AlN layer, a HfN layer, or a SiC layer. In more detail, the AlN layer is available when the temperature of the hot plate is less than about 1000° C., and the HfN layer is available when the temperature of the hot plate is less than about 2800° C.

In addition, the barrier layer may include a SiC layer, a tantalum carbide (TaC) layer, a HfN layer, an AlN layer, a titanium nitride (TiN) layer or a tantalum nitride (TaN) layer. Preferably, the first sub-nano-barrier layer 311 or the second sub-nano-barrier layer 321 of the barrier layer may include the TaC layer, the HfN layer, the SiC layer, the AlN layer, the TiN layer, or the TaN layer.

In detail, the susceptor or the hot plate used at a high temperature of about 1000° C. or more may include the SiC layer, the HfN layer, or the TaC layer. In addition, in order to form an SiC epitaxial coating layer representing high purity, the barrier layer may include the SiC layer and the TaC layer. In addition, when the susceptor or the hot plate is used at a temperature of 1000° C. or less, the barrier layer may include the AlN layer or the TiN layer.

The barrier layer may be formed by alternately laminating the first sub-nano-barrier layer 311 and the second sub-nano-barrier layer 321. Preferably, the barrier layer may be formed by alternately laminating a plurality of the first sub-nano-barrier layers and a plurality of the second sub-nano-barrier layers.

The thermal conductivity of the barrier layer, that is, the first barrier layer, the second barrier layer, or the third barrier layer may be about 10 W/mK or less, and the thermal conductivity of the heat transfer layer including the SiC layer may be about 100 W/mK or more.

The thermal conductivity of the first barrier layer, the second barrier layer, or the third barrier layer may be significantly reduced as compared with the thermal conductivity of the heat transfer layer. In general, although the thermal conductivity of a material is an intrinsic constant value of the material, if the material is coated or deposited at a nano-size level, the thermal conductivity of an individual nano-size material may be significantly reduced as compared with the thermal conductivity of a bulk material before a cutting work.

Therefore, the thermal conductivity of the barrier layer formed by alternately laminating the first sub-nano-barrier layer 322 and the second sub-nano-barrier layer 321, which have a nano size, may be significantly reduced. Preferably, the thermal conductivity of the barrier layer may be about 10 W/mK or less. Accordingly, the anisotropic thermal conduction may be induced in the heat transfer layer interposed between the barrier layers so that the heat transfer in a horizontal direction is represented more strongly than the heat transfer in a vertical direction.

As the heat transfer in the horizontal direction is strongly represented in the heat transfer layer of the hot plate 300, the temperature is uniformly distributed throughout the entire portion of the hot plate 300. Accordingly, the thermal energy can be uniformly supplied to the material, for example, the wafer provided on the hot plate 300. Therefore, the uniform epitaxial layer can be grown from the wafer, so that the electrical characteristic of a device employing the wafer can be improved.

Figure 7:
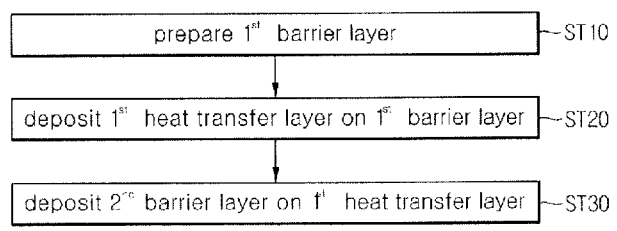
FIG. 7 is a flowchart showing the manufacturing process of the hot plate according to the embodiment.

FIG. 7 is a flowchart showing the method of manufacturing the hot plate according to the embodiment. Hereinafter, the method of manufacturing the hot plate according to the embodiment will be described by making reference to the above description of the hot plate. In other words, the description of the method of manufacturing the hot plate according to the embodiment will be incorporated with the above description of the hot plate.

FIG. 7 is a view showing the manufacturing process of the hot plate according to the embodiment.

Referring to FIG. 7, the method of manufacturing the hot plate according to the embodiment includes a step of preparing the first barrier layer (step ST10), a step of laminating the first heat transfer layer on the first barrier layer (step ST20); and a step of laminating the second barrier layer on the first heat transfer layer. The first barrier layer or the second barrier layer includes a plurality of first sub-nano-barrier layer and a plurality of second sub-nano-barrier layer.

In addition, the method of manufacturing the hot plate according to the embodiment further includes a step of laminating the second heat transfer layer on the second barrier layer, and a step of laminating the third barrier layer on the second heat transfer layer. The third barrier layer may include a plurality of first sub-nano-barrier layers and a plurality of second sub-nano-barrier layers.

The first heat transfer layer or the second heat transfer layer may include an aluminum nitride (AlN) layer, a hafnium nitride (HfN) layer, or a silicon carbide (SiC) layer. The first sub-nano-barrier layer or the second sub-nano-barrier layer may include a tantalum carbide (TaC) layer, a HfN layer, an AlN layer, a titanium nitride (TiN) layer a tantalum nitride (TaN) layer, or an SiC layer.

The thickness of the first heat transfer layer or the second heat transfer layer may be in the range of about 500 nm to about 500 μm, and the thickness of the first barrier layer, the second barrier layer, or the third barrier layer may be in the range of about 500 nm to about 100 μm. The thickness of the first sub-nano-barrier layer or the second sub-nano-barrier layer may be in the range of about 2 nm to about 50 nm. The thickness of a sub-heat transfer layer may be in the range of about 2 nm to about 50 nm.

According to the hot plate manufactured through the manufacturing method of the embodiment, as the heat transfer in the horizontal direction is strongly represented in the heat transfer layer of the hot plate 300, the temperature can be uniformly distributed throughout the entire portion of the hot plate 300. Accordingly, the thermal energy can be uniformly supplied to the material, for example, the wafer provided on the hot plate 300. Therefore, the uniform epitaxial layer can be grown from the wafer, so that the electrical characteristic of a device employing the wafer can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A hot plate comprising:
   a first barrier layer;
   a first heat transfer layer on the first barrier layer;
   a second barrier layer on the first heat transfer layer,
   a second heat transfer layer on the second barrier layer; and
   a third barrier layer on the second heat transfer layer;
   wherein the first barrier layer, the second barrier layer, or the third barrier layer includes a plurality of first sub-nano-barrier layers and a plurality of second sub-nano-barrier layers;
   wherein the first heat transfer layer or the second heat transfer layer includes a silicon carbide (SiC) layer or a hafnium nitride (HfN) layer;
   wherein the first and second barrier layers are in direct physical contact with the first heat transfer layer;
   wherein the second and third barrier layers are in direct physical contact with the second heat transfer layer;
   wherein each first sub-nano-barrier layer is in direct physical contact with at least one of the second sub-nano-barrier layers and each second sub-nano-barrier layer is in direct physical contact with at lease one of the first sub-nano-barrier layers; and
   wherein each first sub-nano-barrier layer and each second sub-nano-barrier layer has nanoscale size.

2. The hot plate of claim 1, wherein the first sub-nano-barrier layer or the second sub-nano-barrier layer includes a tantalum carbide (TaC) layer, a hafnium nitride (HfN) layer, an aluminum nitride (AlN) layer, a titanium nitride (TiN) layer, or a tantalum nitride (TaN) layer.

3. The hot plate of claim 1, wherein the first heat transfer layer or the second heat transfer layer has a thickness in a range of about 500 nm to about 500 µm.

4. The hot plate of claim 1, wherein the first barrier layer, the second barrier layer, or the third barrier layer has a thickness in a range of about 500 nm to about 100 µm.

5. The hot plate of claim 1, wherein the first sub-nano-barrier layer has a thickness in a range of about 2 nm to about 50 nm.

6. The hot plate of claim 1, wherein the second sub-nano-barrier layer has a thickness in a range of about 2 nm to about 50 nm.

7. The hot plate of claim 1, wherein the first barrier layer, the second barrier layer, or the third barrier layer has a thermal conductivity of about 10 W/mK or less.

8. The hot plate of claim 1, wherein the heat transfer layer has a thermal conductivity of about 100 W/mK or more.

9. The hot plate of claim 1, wherein a top surface of the hot plate is coated with silicon carbide.

10. The hot plate of claim 1, wherein a thickness of the first barrier layer is at least 30% of a thickness of the first heat transfer layer.

11. The hot plate of claim 1, wherein a thickness of the second barrier layer is at least 30% of a thickness of the first heat transfer layer.

* * * * *